United States Patent [19]

Schmitt

[11] 4,380,703

[45] Apr. 19, 1983

[54] METHOD AND DEVICE FOR THE REGULATION OF A MAGNETIC DEFLECTION SYSTEM

[75] Inventor: Reinhold Schmitt, Berlin, Fed. Rep. of Germany

[73] Assignee: Siemens Aktiengesellschaft, Berlin & Munich, Fed. Rep. of Germany

[21] Appl. No.: 183,946

[22] Filed: Sep. 4, 1980

[30] Foreign Application Priority Data

Sep. 12, 1979 [DE] Fed. Rep. of Germany ....... 2936911

[51] Int. Cl.³ .............................................. H01J 3/20
[52] U.S. Cl. ............................... 250/396 ML; 250/397
[58] Field of Search ................. 250/492.2, 492.3, 398,
250/397, 396 R, 396 ML; 315/370, 381;
324/239, 244, 225, 260

[56] References Cited

U.S. PATENT DOCUMENTS 3,090,889  5/1963  Levinson ............................ 315/381
3,970,894  7/1976  Yasuda et al. ...................... 315/370
4,125,772  11/1978  Holmes ........................ 250/396 ML

*Primary Examiner*—Alfred E. Smith
*Assistant Examiner*—Carolyn E. Fields
*Attorney, Agent, or Firm*—Hill, Van Santen, Steadman, Chiara & Simpson

[57] ABSTRACT

In an exemplary embodiment, a command value signal is supplied to a magnetic deflection control loop which operates based on measurement of deflection coil current. A signal proportional to the rate of change of deflection magnetic field is supplied to one input of a differential amplifier, and a signal in accordance with the rate of change of the command value signal is connected with a second input of the differential amplifier. Any error between the rate of change signals as sensed by the differential amplifier is used as an auxiliary control of the deflection magnetic field, whereby eddy current influences are overcome. The system is particularly useful for precision control of an electron beam writer in the manufacture of semiconductor integrated circuits.

5 Claims, 1 Drawing Figure

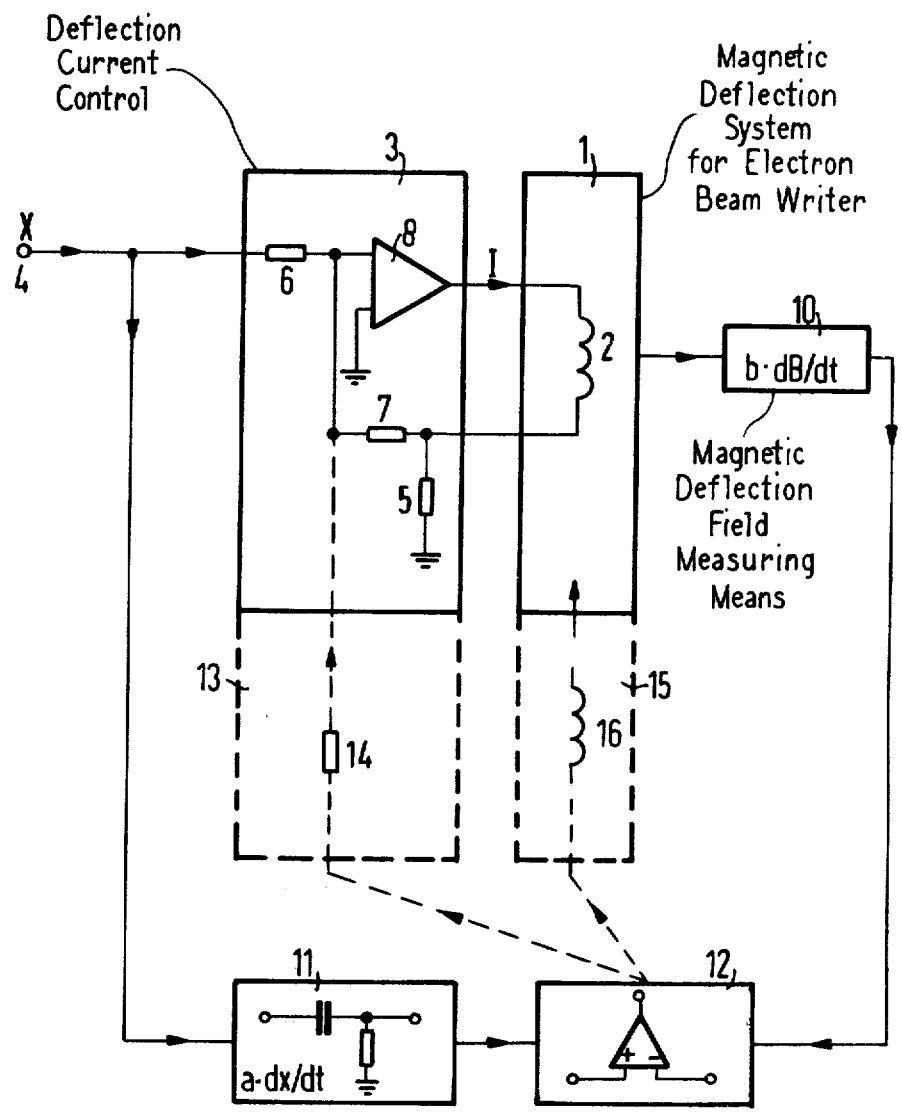

METHOD AND DEVICE FOR THE REGULATION OF A MAGNETIC DEFLECTION SYSTEM

BACKGROUND OF THE INVENTION

The invention relates to a method for regulating a magnetic deflection system for a particle radiation optical device, particularly an electron beam writer, in which the current flowing through the deflection coils is measured and a control signal for the readjustment of the coil current is generated by means of comparison with a command value. The invention further relates to a device for implementing this method.

In order to achieve short write times with an electron beams writer in the exposure of semiconductor wafers, a rapid and high-precision deflection system for the electron beam is required in addition to a high beam current density and a rapid data processing. Given the employment of magnetic deflection systems, the magnetic field is determined by measuring and regulating the coil current in deflection coils. The coil current can be simply measured with sufficient precision in order to achieve the required precision of the magnetic fields from $10^{-4}$ through $10^{-5}$ even given the small magnetic fields of a few $10^{-4}$ Tesla hereby occurring. Rapid changes of magnetic field, however, are influenced by eddy currents which are induced in surrounding, conductive components. Under certain conditions, thus, the magnetic field cannot quickly enough follow the command value. A current regulation with additional differential behaviour is only admissible insofar as no overshoot (or: ringing) occurs beyond the allowed tolerances by so doing.

A control system which is based on a direct measurement of the magnetic field could avoid these problems. In so doing, however, there is difficulty in statically and dynamically measuring the small magnetic fields with the precision required here.

The greatest possible employment of nonconductive materials, ferrite shields and the observance of the greatest possible intervals from conductive surfaces only produces limited success.

SUMMARY OF THE INVENTION

The object of the present invention is to expand a method and a corresponding device of the type initially cited in such manner that the magnetic field always quickly and precisely tracks (or: follows) the command value independently of influences due to eddy currents.

This object is inventively achieved by means of the method steps specified in the characterizing part of claim 1.

A combined control is here inventively proposed. In the static case, the control ensues via the measurement of the coil current, whereby the required precision can be observed. Given changes of command value, a second control loop is superimposed: with the assistance of a magnetic field measuring means, a signal proportional to the field rate of change dB/dt is generated and compared to the command value rate of change dx/dt gained by means of differentiation of the command value x. If the magnetic field does not track the command value quickly enough then an additional actuating signal occurs as a function of the error between the rate signals.

It is provided in an advantageous further development of the invention that the additional control signal influences the readjustment of the coil current. However, it is possible with the same advantage that the additional control signal directly influence the magnetic field. A high degree of compensation of delays caused by eddy currents is achieved by means of these simple measures given high precision at the same time. The measures for improving the control behavior initially cited, for example, by means of incorporating a differential component, can also be advantageously applied within the framework of the inventive principle.

Given a device for implementing the inventive method with a known current regulation, the solution of the said object is characterized in that a magnetic measuring device is provided in which the signal proportional to the field change dB/dt is generated; in that the command value is additionally supplied to a differentiating circuit; and in that the outputs of the magnetic field measuring means and the differentiating circuit are connected to a respective input of a differential amplifier whose output is connected to the control means for the coil current. It is just as advantageously possible that the output of the differential amplifier is connected to auxiliary coils in the deflection system. An induction coil with impedance buffer or a Hall generator with differentiating circuit or a magnetoresistor with linearization and differentiating circuit can be employed for the magnetic field measuring means, for example.

In the following, an exemplary embodiment of the invention is described and explained in greater detail on the basis of a FIGURE on the accompanying drawing sheet; and other objects, features and advantages will be apparent from this detailed disclosure and from the appended claims.

BRIEF DESCRIPTION OF THE DRAWING

The sole FIGURE shows a block diagram of a device for the rapid and precise magnetic field regulation for an electron beam writer.

DETAILED DESCRIPTION

Greatly simplified, the FIGURE shows a deflection system 1 with a single deflection coil 2. In practice, at least one pair of coils symmetrically arranged with respect to the axis of the electron beam writer, preferably, however, a two stage deflection system with two pairs of coils lying behind one another along the beam path, is employed in electron beam writers for deflecting the electron beam. The deflection system 1 is driven via a current control 3. The command value x is supplied to the current control at its input 4. For example, a via a computer-controlled program. In this exemplary embodiment, a simple current control is indicated in which the current I flowing through the deflection coil 2 generates a voltage drop to ground at a resistor 5. This voltage, like the command value x, is supplied to an amplifier 8 equipped with the two input resistors 6 and 7, being supplied for the purpose of comparison. This regulation of the magnetic field via the current regulation suffices, in the static operating case, in order to observe the required magnetic field with the precision demanded. Given rapid changes of magnetic field, a second control circuit is now superimposed. With the assistance of a measuring means 10, for example, an induction coil with impedance buffer (or impedance converter), a signal b·dB/dt proportional to the rate of change of magnetic field intensity B is generated. The multiplication factor b depends on the type of measuring means employed and is necessary in order to render a comparison with the differentiated command value dx/dt possible. The command value x is differentiated in a differentiating circuit 11. A signal a·dx/dt derives. The factor a is a multiplication factor which takes the type of differentiating circuit employed into consideration. The two signals generated in this manner are supplied to a differential amplifier 12. In case the magnetic field does not track (or: follow) the command value x quickly enough, then a further actuating signal arises in the differential amplifier which either influences the current regulating circuit via an element 13 with a resistor 14 or directly influences the magnetic field via an element 15 with an auxiliary coil 16.

Since every differentiating circuit in practice fundamentally exhibits an error dependent on the frequency, it can be advantageous under certain conditions to insert a correction element into the branch between the measuring means 10 and the differential amplifier 12, said correction element in turn eliminating the error as a function of frequency.

It will be apparent that many modifications and variations may be effected without departing from the scope of the novel concepts and teachings of the present invention.

I claim as my invention:

1. A method for regulating a magnetic deflection system for a particle radiation optical device, particularly an electron beam writer, in which the current flowing through deflection coil means is measured and a control signal is generated in a first control loop for readjusting the deflection magnetic field produced by said deflection coil means by means of comparison with a command value, characterized in that given changes in the command value supplied to the first control loop, a second control loop is superimposed for supplementing the control action of said first control loop in that a signal proportional to the magnetic field rate of change (dB/dt) is generated and is compared in the second control loop to a value proportional to the command value rate of change (dx/dt); and in that the comparison output of the second control loop serves as an additional control signal for controlling the deflection magnetic field.

2. A method for regulating a magnetic deflection system according to claim 1, characterized in that the additional control signal influences the readjustment of the coil current (I).

3. A method for regulating a magnetic deflection system according to claim 1, characterized in that the additional control signal directly influences the deflection magnetic field.

4. A device for regulating particle radiation deflection, said device comprising a magnetic deflection system in the form of deflection coil means, a first control loop for measuring the current flowing through the deflection coil means and for readjusting the deflection magnetic field by means of comparison with a command value (x), said first control loop comprising control means for controlling the magnetic field produced by the deflection coil means and operative to produce a magnetic field rate of change (dB/dt), and having a command input for receiving the command value (x), characterized in that a second control loop is superimposed on said first control loop for supplementing the control action of said first control loop, said second control loop comprising magnetic field measuring means (10) in which a signal proportional to the magnetic field rate of change (dB/dt) is generated; a differentiating circuit (11) for receiving the command value (x), and a differential amplifier (12) having respective inputs connected with the output signals of the magnetic field measuring means (10) and of the differentiating circuit (11), and having an output connected to the control means (3) for controlling the deflection magnetic field to minimize the error between said output signals.

5. A device for regulating particle radiation defection, said device comprising a magnetic deflection system formed of deflection control means including main and auxiliary coil means, a first control loop for measuring the current flowing through the main coil means and for readjusting the deflection magnetic field by means of comparison with a command value (x), said first control loop comprising deflection control means for controlling the current in said main coil means, and a command value input for supplying the command value (x), characterized in that a second control loop is superimposed on said first control loop for supplementing the control action of said first control loop, said second control loop comprising magnetic field measuring means (10) in which a signal proportional to the deflection magnetic field rate of change (dB/dt) is generated; a differentiating circuit (11) coupled with the command value input and operable to supply at its output a signal proportional to the rate of change of the command value, and a differential amplifier (12) having respective inputs connected with the outputs of the magnetic field measuring means (10) and of the differentiating circuit (11) and having its output connected to said auxilary coil means (16) in the deflection system (1).

* * * * *